United States Patent [19]

Graziadei

[11] 3,912,946

[45] Oct. 14, 1975

[54] AUTOMATIC-VOLUME-CONTROL SYSTEM FOR A-C SIGNALS

[75] Inventor: Rinaldo Graziadei, Monza, Italy

[73] Assignee: SGS-ATES Componenti Elettronici S.p.A., Agrate Milan, Italy

[22] Filed: Oct. 21, 1974

[21] Appl. No.: 516,506

[30] Foreign Application Priority Data

Oct. 19, 1973 Italy .................................. 30290/73

[52] U.S. Cl. ................ 307/264; 307/237; 329/192; 329/205 R; 330/18; 330/29; 330/38 M; 330/141

[51] Int. Cl.$^2$ ........................................... H03K 1/14

[58] Field of Search......... 330/22, 18, 29, 32, 38 M, 330/40, 141; 307/237, 264; 329/101, 192, 205 R

[56] References Cited

UNITED STATES PATENTS 3,582,681 6/1971 Norman et al.................... 330/29 X

*Primary Examiner*—James B. Mullins
*Attorney, Agent, or Firm*—Karl F. Ross; Herbert Dubno

[57] ABSTRACT

An AVC system for alternating-current signals, generated by a constant-gain amplifier, comprises an R/C network preceded by a diode and followed by a set of monolithically integrated transistors of like conductivity type (NPN) connected in two cascaded groups across a source of direct current. Each group consists of a pilot transistor and a final transistor, the pilot transistor of the first group having its base connected to the capacitor of the R/C network whereas the emitter of the final transistor of that group is tied to the base of the pilot transistor and to the collector of the final transistor of the second group. Corresponding transistors of the two groups have the same direct-current gain, and the combined direct current drawn by the transistors of the first group substantially equals that drawn by the transistors of the second group.

6 Claims, 2 Drawing Figures

AUTOMATIC-VOLUME-CONTROL SYSTEM FOR A-C SIGNALS

FIELD OF THE INVENTION

My present invention relates to an automatic-volume-control system for alternating currents, in particular a system of this nature designed to be inserted between the output of a constant-gain a-c amplifier and a load driven thereby, e.g. a recording head for a magnetic tape recorder.

BACKGROUND OF THE INVENTION

AVC circuits are known wherein a capacitor, forming part of an R/C network, stores a charge corresponding to the mean signal voltage. In a conventional system of this type, the capacitor works into a pair of cascaded transistors constituting a voltage divider connected across a direct-current power supply whose internal impedance is low at the operating signal frequencies. A tap on that voltage divider, constituted by a junction between the emitter of the first and the collector/base of the second transistor (the latter being connected as a diode), delivers an attenuated output signal to the load. A change in the capacitor charge shifts the operating point of the first transistor along its nonlinear characteristic to alter its dynamic voltage range; a corresponding shift in the operating point of the second transistor is designed to compensate for the nonlinear distortion of the signal, the two transistors being differentially connected to the load circuit.

The time constant of the R/C network should be large in order to prevent its storage capacitor from discharging too rapidly in response to low-amplitude input signals which would blur the contrasts between different sound intensities, for example. As the capacitor is shunted by the input resistance of the first transistor, this resistance should thus be as high as possible. It therefore becomes necessary to design the first transistor with a large current gain which, however, cannot be matched by the second transistor, owing to the different functions and modes of connection of the two transistors. This, in turn, results in a distorted output signal with a particularly high third-harmonics content.

OBJECT OF THE INVENTION

The object of my present invention is to provide an improved AVC system of this general character satisfying the heretofore irreconcilable requirements of large time constant and low-distortion output.

SUMMARY OF THE INVENTION

I realize this object, in accordance with my present invention, by replacing the two individual transistors of the aforedescribed prior-art system with two groups consisting each of *n* cascaded transistors, *n* being an integer preferably equal to but possibly greater than 2. The transistors of each group include a pilot transistor and a final transistor, the first pilot transistor having an input electrode connected to the capacitor of the R/C network whereas the second pilot transistor has an input electrode tied to a junction formed between the two final transistors which are connected in tandem across the terminals of the d-c power supply. Corresponding transistors of the two groups are of like conductivity type and have substantially the same direct-current gain; advantageously, all the transistors are of the same conductivity type (e.g. NPN). A load circuit connected to the junction of the final transistors is differentially energized thereby with an attenuated replica of the a-c input signals.

If the direct-current gain of the pilot transistors is substantially higher than that of the final transistors, the second pilot transistor will draw only a small input current from the first final transistor; thus, the combined direct current drawn by the transistors of the first group substantially equals that drawn by the transistors of the second group.

Advantageously, the several transistors are monolithically integrated with one another to insure maximum uniformity between corresponding stages of the two groups.

BRIEF DESCRIPTION OF THE DRAWING

The above and other features of my invention will now be described in detail with reference to the accompanying drawing in which.

SPECIFIC DESCRIPTION

Figure 1:
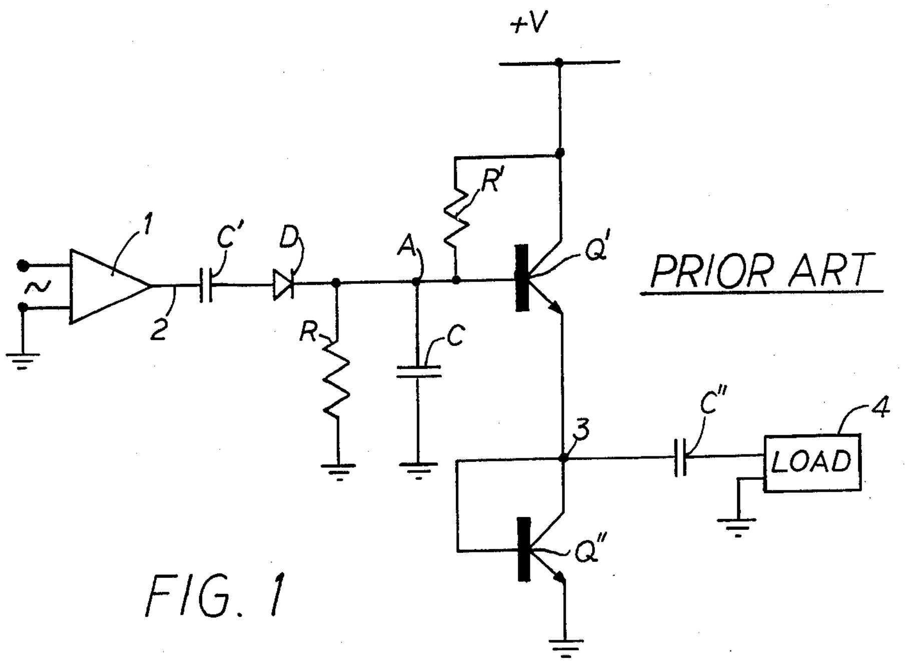
FIG. 1 is a circuit diagram of a conventional AVC system of the type referred to above.

The prior-art system shown in FIG. 1 comprises a constant-gain amplifier 1, serving as a source of alternating-current signals, whose output 2 is connected through a blocking capacitor C′ and a rectifying diode D to an integrating network consisting of a shunt capacitor C in parallel with a resistor R. The ungrounded terminal A of capacitor C is tied to the base of an NPN transistor Q′ whose collector is returned to that base through a biasing transistor R′ and is also connected to the positive terminal +V of a d-c power supply whose negative terminal is grounded. This power supply has a low internal impedance in the frequency range of the incoming a-c signals. The emitter of transistor Q′ is tied to the base and the collector of another NPN transistor Q″, connected as a diode, whose emitter is grounded. The junction 3 of these two transistors is coupled through another blocking capacitor C″ to a load 4, e.g. a magnetic recording head.

As will be readily apparent, the time constant of the integrating network is determined not only by its impedances R and C but also by the effective input resistance of transistor Q′ in parallel therewith. For the reasons explained above, this input resistance should be as high as possible but the resultant disparity between the current gains of transistors Q′ and Q″ tends to introduce serious third-harmonics distortions into the output signal delivered to the load 4, particularly with higher signal amplitudes.

Figure 2:
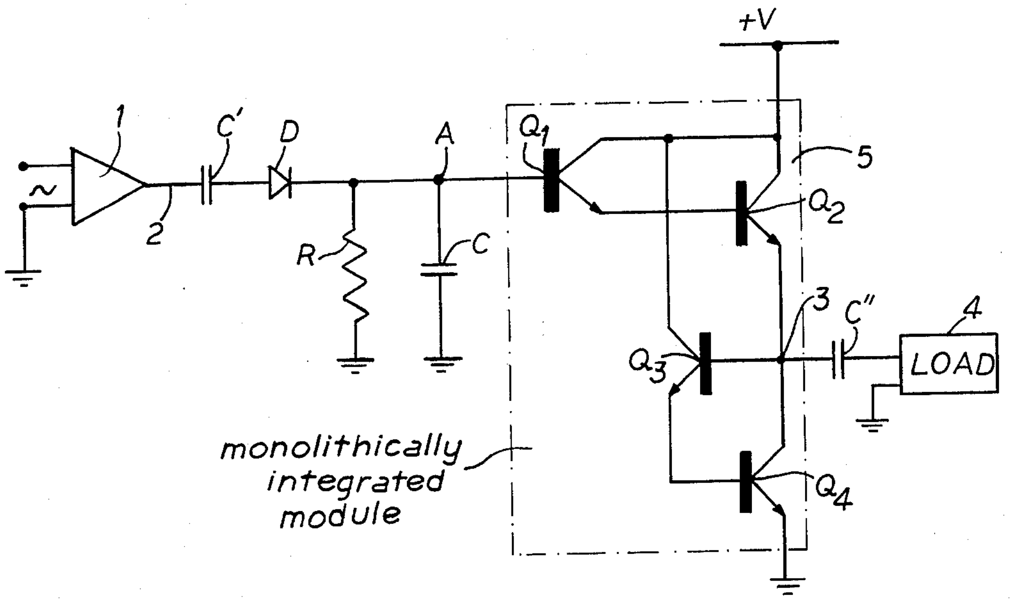
FIG. 2 is a similar circuit diagram illustrating my present improvement.

In FIG. 2, in which elements left unchanged from FIG. 1 have been designated by the same reference characters, I have shown transistors Q′ and Q″ replaced by a set of four transistors $Q_1$–$Q_4$ forming two groups $Q_1$, $Q_2$ and $Q_3$, $Q_4$. The four transistors are all of the same NPN conductivity type and are part of a monolithically integrated module 5.

The first pilot transistor $Q_1$ has its base connected to capacitor terminal A and its collector energized directly from positive terminal +V in parallel with the collectors of the second pilot transistor $Q_3$ and the first final transistor $Q_2$. The emitter of the first pilot transistor $Q_1$ is tied to the base of the first final transistor $Q_2$ whose emitter forms a junction 3 with the collector of the second final transistor $Q_4$. The latter transistor, whose emitter is grounded, has its base tied to the emitter of the second pilot transistor $Q_3$ whose base is directly connected to junction 3.

Since it is no longer necessary to match the current gain of the transistor directly energized by the storage capacitor C to that of a transistor differentially connected therewith to the junction 3 leading to the load circuit, the requirements of a large time constant and a low-distortion output signal can be easily met.

Pilot transistors $Q_1$ and $Q_3$ have a direct-current gain which is much higher than the direct-current gain of final transistors $Q_2$ and $Q_4$. The two pilot transistors are practically identical, as are the two final transistors.

Since transistor $Q_3$ draws little energy from junction 3, the tandem-connected transistors $Q_2$ and $Q_4$ are traversed by almost the same direct current. The operating currents of pilot transistors $Q_1$ and $Q_3$, which correspond to the base currents of the associated final transistors $Q_2$ and $Q_4$, are relatively small and also substantially identical. In view of the differential connection of transistors $Q_2$ and $Q_4$ to junction 3, the amplitude of the attenuated output signals delivered to load 4 is determined by the pilot transistor $Q_3$ whose operating characteristics match those of transistor $Q_1$.

The large time constant realizable with this arrangement allows the capacitor C to retain its charge for a prolonged period in the face of varying signal amplitudes so that, for example, a pianissimo passage may be faithfully recorded after a succession of louder notes.

Although only two cascaded transistors per group have been illustrated in FIG. 2, that number could be increased if higher signal amplitudes are to be stepped down. It is also possible to insert several similar sets of transistors $Q_1$–$Q_4$ in series with one another between terminal A and junction 3.

I claim:

1. An automatic-volume-control system comprising:

a source of alternating-current signals;

rectifying means connected to said source;

a time-constant network including a storage capacitor connected to said source through said rectifying means;

a first group of $n$ cascaded transistors including a first pilot transistor and a first final transistor, n being an integer greater than one;

a second group of $n$ cascaded transistors including a second pilot transistor and a second final transistor;

an operating circuit for said transistors including a direct-current power supply with two terminals, said first pilot transistor having an input electrode tied to said capacitor, said final transistors being connected in tandem across said terminals and forming a junction, said second pilot transistor having an input electrode tied to said junction, corresponding transistors of said groups being of like conductivity type and having substantially the same direct-current gain; and a load circuit connected to said junction for differential energization by said final transistors with an attenuated replica of said alternating-current signals.

2. A system as defined in claim 1 wherein each of said transistors has a base, an emitter and a collector, said input electrodes being bases, all said transistors being of like conductivity type.

3. A system as defined in claim 2 wherein $n = 2$, the collectors of said first and second pilot transistors and of said first final transistor being tied to one of said terminals, the emitter of said second final transistor being tied to the other of said terminals, the emitter of each pilot transistor being tied to the base of the final transistor of the same group; said junction being connected to the emitter of said first final transistor, the base of said second pilot transistor and the collector of said second final transistor.

4. A system as defined in claim 3 wherein the direct-current gain of said pilot transistors is substantially higher than the direct-current gain of said final transistors.

5. A system as defined in claim 1 wherein said source is a constant-gain amplifier.

6. A system as defined in claim 1 wherein said transistors are part of a monolithically integrated module.

* * * * *